United States Patent [19]
Manning et al.

[11] Patent Number: 5,405,788
[45] Date of Patent: Apr. 11, 1995

[54] METHOD FOR FORMING AND TAILORING THE ELECTRICAL CHARACTERISTICS OF SEMICONDUCTOR DEVICES

[75] Inventors: Monte Manning, Kuna; Charles Dennison, Boise; Howard Rhodes, Boise; Tyler Lowrey, Boise, all of Id.

[73] Assignee: Micron Technology, Inc., Boise, Id.

[21] Appl. No.: 66,835

[22] Filed: May 24, 1993

[51] Int. Cl.$^6$ .......................................... H01L 21/265
[52] U.S. Cl. ...................................... 437/29; 437/69; 437/52
[58] Field of Search ............................ 437/69, 29, 41; 257/903, 904

[56]  References Cited

U.S. PATENT DOCUMENTS

| | | | |
|---|---|---|---|
| 4,442,591 | 4/1984 | Haken | 29/571 |
| 4,546,535 | 10/1985 | Shepard | 29/571 |
| 4,613,885 | 9/1986 | Haken | 357/42 |
| 4,728,619 | 1/1988 | Pfiester et al. | 437/34 |
| 4,735,915 | 4/1988 | Kita et al. | 437/52 |
| 5,102,811 | 4/1992 | Scott | 437/31 |
| 5,168,335 | 12/1992 | D'Arrigo et al. | 257/319 |
| 5,173,438 | 12/1992 | Sandhu | 437/63 |
| 5,240,874 | 8/1993 | Roberts | 437/69 |
| 5,268,585 | 12/1993 | Yamauchi | 257/316 |

FOREIGN PATENT DOCUMENTS 56-87340 7/1981 Japan.
1-196121 8/1989 Japan.

OTHER PUBLICATIONS

Wolf, S. "Silicon Processing for the VLSI Era", Lattice Press, Sunset Beach, Calif., 1990, pp. 23–25, 333, 428–31 & 691 ∝ 3.
Wolf, Stanley, "Silicon Processing for the VLSI Era" Lattice Press Sunset Beach, Calif., vol. 2 1990.

Primary Examiner—George Fourson
Assistant Examiner—David M. Mason
Attorney, Agent, or Firm—Stephen A. Gratton

[57]  ABSTRACT

A method for forming semiconductor devices includes a low energy implant for tailoring the electrical characteristics of the semiconductor devices. Using the low energy implant, narrow width devices such as access transistors in an SRAM cell, can be fabricated with a low threshold voltage (Vt). The low energy implant is performed on the active areas of a silicon substrate following field isolation and field implant. For an n-conductivity access transistor, the low energy dopant can be an n-type dopant such as phosphorus, arsenic or antimony.

15 Claims, 3 Drawing Sheets

METHOD FOR FORMING AND TAILORING THE ELECTRICAL CHARACTERISTICS OF SEMICONDUCTOR DEVICES

FIELD OF THE INVENTION

This invention relates to semiconductor manufacture and more particularly to a method forming and tailoring the electrical characteristics of semiconductor devices. The method of the invention is particularly adapted to fabricating narrow width semiconductor devices with a low threshold voltage (Vt).

BACKGROUND OF THE INVENTION

As the semiconductor industry advances, the sizes of active semiconductor devices have shrunk to submicron dimensions. This has required the formation of devices that push the limits of current manufacturing processes, such as photolithography. Specifically, it is difficult to form submicron semiconductor devices having acceptable electrical characteristics using current manufacturing techniques.

Semiconductor devices formed with a narrow width (i.e. narrow width devices) are particularly affected by decreasing geometries. As an example, narrow width MOS transistors are difficult to fabricate with an acceptable threshold voltage or (Vt).

In a MOS transistor, the threshold voltage (Vt) is the voltage that must be applied to the gate region of the transistor before a current will flow in the channel under the gate region. In general, higher threshold voltages are undesirable because higher power supplies are required for operating the semiconductor devices. In addition, with higher threshold voltages, the semiconductor devices are slower. Moreover, if the threshold voltage (Vt) of an access device for a memory cell is too high, then it is more difficult to write data into the cell.

FIGS. 1A–1D illustrate the difficulty of forming narrow width access transistors with an acceptable threshold voltage in an SRAM cell. As shown in FIG. 1A, a semiconductor fabrication process begins with a silicon substrate 10. Depending on the circuit requirements, different conductivity regions such as n-wells or p-wells (not shown) may be formed on the substrate 10, by various well known processes. The substrate 10 is then-typically covered with a pad oxide 12. A silicon nitride mask 14 is then deposited on the substrate 10.

The silicon nitride mask 14 is photopatterned and etched in a predetermined pattern. After etching, and as shown in FIG. 1B, the silicon nitride mask 14 includes a pattern of solid areas 16, 18 and open areas 20. This pattern is repeated many times. The open areas 20 of the silicon nitride mask 14 expose the areas of the substrate 10 where future field isolation oxide will be formed. The solid areas 16, 18 of the silicon nitride mask 14 cover areas on the substrate 10 on which future active devices will be formed.

In an SRAM cell, the active devices may include access transistors formed with a narrow width. The width of such narrow width access transistors may be in the range of 0.4 to 1 μm. Narrow width active devices, such as access transistors, will be formed under the narrow width solid areas 16 of the nitride mask 14. Conventional width active devices, such as the pull-down transistors for the SRAM cell, will be formed under the solid areas 18 of the nitride mask.

After formation of the silicon nitride mask 14 and as shown in FIG. 1C, a local oxidation of silicon process (LOCOS) is performed on the substrate 10. During the LOCOS process, a field oxide (FOX) 22 is formed on the substrate 10 in the open areas 20 (FIG. 1B) of the nitride mask 14. The field oxide 22 grows not only vertically in the exposed areas 20 of the substrate 10 but also laterally underneath the edges of the silicon nitride mask 14. This lateral encroachment under the silicon nitride mask 14 is known as the "bird's beak" 28.

Following the formation of the field oxide 22, the silicon nitride mask 14 is removed. Active semiconductor devices will be formed in active areas 24, 26 of the substrate 10 between the areas of field oxide 22. An SRAM cell may include narrow width active areas 24 and conventionally sized active areas 26.

Next, and as shown in FIG. 1D, the field oxide 22 is subjected to a local implanted field, or LIF step. During the LIF step a field implant dopant 34 is introduced into the field oxide 22 using ion implantation. In general, the LIF step is used to isolate individual active devices from one another.

For isolating NMOS devices, a p-type dopant such as boron is used as the field implant. For isolating PMOS devices, an n-type dopant such as phosphorus is used as the field implant. Implantation of the dopants during the LIF step is performed at an energy level that causes the field implant dopant 34 to penetrate through the field oxide 22 and enter the substrate 10. The peak concentration of the field implant dopant 34 into the substrate 10 is indicated in FIG. 1D by the dotted line 36.

During the LIF step, the active areas 24, 26 of the substrate 10 are protected from the field implant dopant 34 by a patterned layer of field implant photoresist 32. The field implant photoresist 32 is deposited and patterned using standard photolithographic techniques. This may include deposition of a photosensitive photoresist, followed by photopatterning using a reticle, and then developing.

With a high density SRAM cell, the width of the narrow width active area 24 is close to the minimum feature size for current photolithographic processes (e.g., 0.4 μm to 1 μm). It is difficult to precisely align the pattern of the field implant photoresist 32 with the pattern of the narrow width active areas 24. Any misalignment between the field implant photoresist 32 and the narrow width active areas 24 will leave the narrow width active areas 24 unprotected during the LIF step.

The threshold voltage (Vt) of a narrow width active device such as the access device for a memory cell, is very sensitive to the dopant concentration in the substrate 10. In a narrow width device, when the LIF is slightly misaligned, the region of the device that undesirably receives the LIF implant is a much larger percentage of the total device width than it is in wider devices. Thus, misalignment of the LIF and subsequent diffusion can cause the channel region of a narrow width device to have a much higher dopant concentration than the majority of the width in a wider device. Hence, the narrow device Vt increases. In general, a p-type field implant dopant, such as boron, will cause the threshold voltage (Vt) of an n-channel transistor to increase. Conversely, an n-type field implant dopant, such as phosphorus, will cause the threshold voltage (Vt) of an p-channel transistor to decrease.

The threshold voltage (Vt) of the active devices is also affected by diffusion of the field implanted dopant 32 under the bird's beaks 28 of the field oxide 22. Specifically, during various thermal cycles used in the semiconductor manufacturing process, the field implant dopant 32 may migrate under the narrow width active areas 24. As shown in FIG. 2, the field implant dopant 32 may diffuse into the future MOS device channel region 38. This diffusion is indicated by the dotted lines 40 in FIG. 2.

This unwanted diffusion of the field implant dopant 32 decreases the effective electrical width ($W_1$) of the active area 24. The effective electrical width ($W_1$) of the active area 24 is thus less than the actual width ($W_2$) of the active area 24. As the effective electrical width ($W_1$) of an access device approaches zero, the threshold voltage (Vt) of the access device increases due to field implant dopant diffusion into the channel region 38. This is also sometimes referred to as the "narrow width effect". This is an undesirable condition because as previously stated, a high threshold voltage (Vt) for an access device is undesirable.

In view of these shortcomings associated with the manufacture of semiconductor devices, there is a need in the art for improved methods for forming and tailoring the electrical characteristics of semiconductor devices and particularly narrow width devices with an acceptable threshold voltage (Vt). Additionally, there may be situations that arise in semiconductor circuit design where select devices other than narrow width devices may require non-standard threshold voltages (Vt). These special devices may need either a higher or a lower threshold voltage (Vt) from the nominal.

Accordingly, it is an object of the present invention to provide an improved method for forming semiconductor devices and for tailoring the electrical characteristics, of semiconductor devices such as the threshold voltage of select semiconductor devices. It is another object of the present invention to provide a method for tailoring the electrical characteristics of different regions of a semiconductor device such as raising the transistor Vt while minimizing any increase of junction capacitance of the source region relative to the drain region of a transistor. It is a further object of the present invention to provide a method for forming narrow width semiconductor devices that overcomes the "narrow width effect". It is a still further object of the present invention to provide a method for tailoring the electrical characteristics of select semiconductor devices that is efficient, low cost and adaptable to large scale semiconductor manufacture.

SUMMARY OF THE INVENTION

In accordance with the present invention, a method of forming and tailoring the electrical characteristics of a semiconductor device is provided. The method of the invention includes the selective exposure of active areas of a device during field implant and a low energy implant performed following the field implant to tailor the electrical characteristics of the active areas. The low energy implant may be used to fabricate a semiconductor device with a non-standard threshold voltage (Vt). As an example, the low energy implant is particularly adapted to lowering the threshold voltage (Vt) of narrow width access devices. The low energy implant may also be used however, with standard width devices and may be used to raise or lower the threshold voltage (Vt) of a device.

In an illustrative embodiment of the invention, an SRAM cell having narrow width n-channel access transistors is fabricated. Initially, active areas are formed on a substrate using conventional processes. The active areas include narrow width active areas for the access transistors of the SRAM cell and standard width active areas for the pulldown transistors.

The active areas of the substrate are isolated using a standard field oxidation process such as LOCOS. Field implant of a dopant into the substrate is then performed. During field implant, the narrow width active areas are left exposed so that the field implant dopant is also implanted into the narrow width active areas. Following field implant, a low energy dopant is implanted into the narrow width active areas in order to compensate for the field implant dopant. This enables the narrow width n-channel access transistors of the SRAM cell to be formed with a threshold voltage (Vt) that matches the wider pulldown devices.

If a p-type field implant dopant, such as boron, is used, a suitable low energy dopant is an n-type dopant. Suitable n-type low energy dopants include phosphorus, arsenic and antimony. The low energy implant is preferably performed at an energy level low enough that the low energy dopant does not penetrate the birds beak area of the field oxide. Alternately, the process can be designed to accommodate some penetration of the bird's beak area but still not penetrate the thick field oxide.

The method of the invention may also be used to tailor the electrical characteristics of different regions of a semiconductor device relative to one another, such as a source region of a transistor relative to the drain region. As an example, in memories such as DRAMs, it is desirable to achieve a bitline capacitance that is as low as possible. A major component in this capacitance is the junction capacitance of the N+ A.A. contact to the bit line adjacent to the access device. To lower this capacitance, the electrical characteristics of the bit line side of the access device (e.g. source or drain) can be protected (covered) by the LIF photomask while the cell side and channel region of the access device are exposed during the field implant step. By protecting the bit-line side of the access device during the field implant, while exposing the cell side, a lower junction capacitance on the bit line side can be achieved. A low energy implant may or may not then be used to further tailor the cell side junction of the access transistor.

As another example, the alternate embodiment method can be used in a DRAM circuit where the NMOS array access transistors have a more stringent subthreshold leakage constraint than the NMOS transistors in the periphery. In a DRAM with NMOS transistors used in the array as access devices, the entire array area can be exposed to the LIF field implant (e.g. boron@140–200 keV) followed by an additional low energy boron implant (approximately less than 50 keV) to further increase the access transistor Vt while not raising the periphery NMOS Vt's. In a DRAM operation, one negative impact of exposing the entire array active area pattern to the LIF field implant is that the bit line bottom junction capacitance will increase. An alternative embodiment is to partially cover the array active area at the future bit line contact area (still exposing all or part of the future access channel region and storage node side) thus increasing the access Vt while not raising bit line junction capacitance.

These and other objects, features and advantages of the invention will be apparent from the following more particular description of the preferred embodiments of the invention as illustrated in the accompanying drawings.

DETAILED DESCRIPTION OF THE PREFERRED EMBODIMENTS

The method of the invention is illustrated in FIGS. 3A-3D in the fabrication of narrow width access transistors (i.e. MOFSETs) for an SRAM cell. More specifically, the method of the invention is illustrated in the formation of narrow width n-channel transistors having a relatively low threshold voltage (Vt) when compared to conventional narrow width devices. The method of the invention may also be used, however, in the fabrication and tailoring of the electrical characteristics of narrow width p-channel transistors. In addition, the method of the invention may be used in the formation and tailoring of the electrical characteristics of conventional width transistors. Furthermore, the method of the invention may be used in the formation and tailoring of the electrical characteristics of different regions of an active device such as the source and drain regions of a transistors.

Figure 1A:
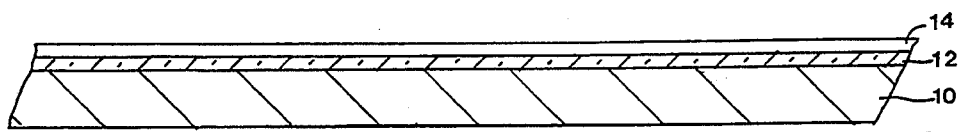
FIGS. 1A-1D are schematic drawings of a prior art semiconductor process for forming an SRAM cell having narrow width devices.
Figure 1B:
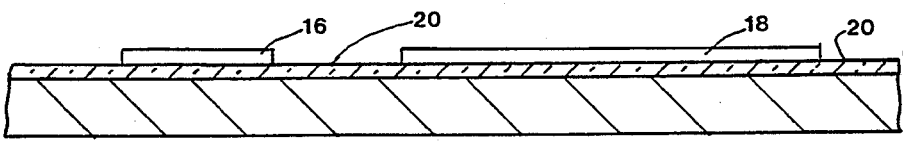
Figure 1C:
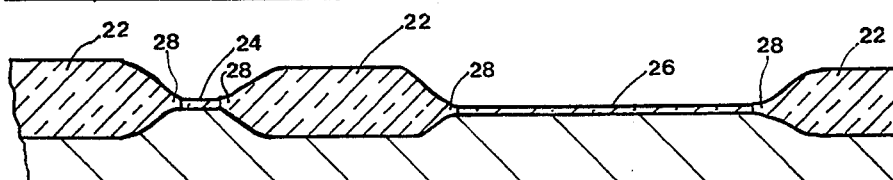
Figure 1D:
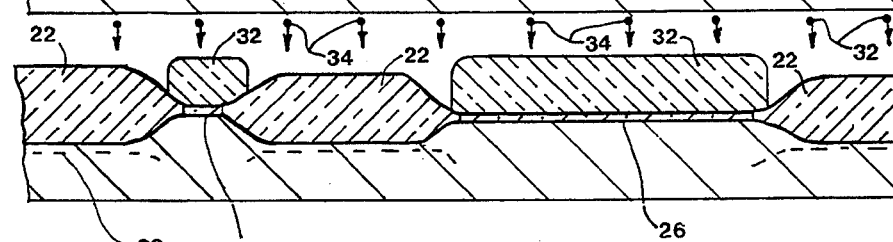
Figure 2:
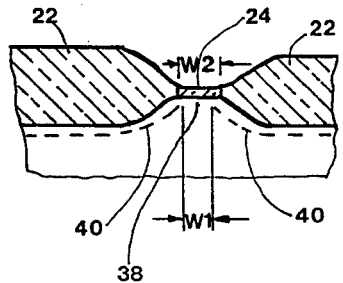
FIG. 2 is a schematic drawing of a prior art narrow width active area of a semiconductor device showing the encroachment of an implant dopant into the conducting channel of the active area.
Figure 3A:
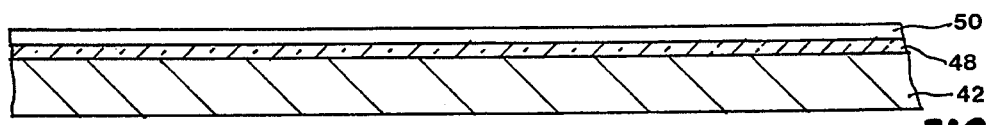
FIGS. 3A-3D are schematic drawings showing a process for forming an SRAM cell having narrow width semiconductor devices in accordance with the method of the invention.
Figure 3B:
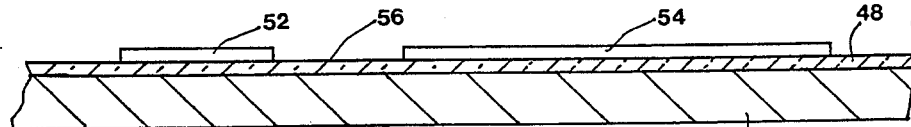

Referring now to FIG. 3A, a silicon substrate 42 is provided. An implant step may have previously been performed on the silicon substrate 42 to define different regions on the substrate. These regions may include various conductivity regions, such as n-wells and p-wells (not shown), which may be formed by well known processes. Initially, a pad oxide 48 is formed on the substrate 42. A silicon nitride mask 50 is then formed on the substrate As shown in FIG. 3B, the silicon nitride mask 50 is patterned with solid areas 52, 54 and open areas 56. The open areas 56 of the silicon nitride mask 50 expose areas of the substrate 42 where future isolation oxide will be formed. The solid areas 52, 54 of the nitride mask 50 expose areas of the substrate 42 on which future active devices will be formed.

As with the semiconductor structure illustrated in FIGS. 1A-1D, the substrate 42 includes narrow width active areas 44 and conventional width active areas 46. Narrow width access transistors for the SRAM cell will be formed in the narrow width active areas 44. Conventionally sized pulldown transistors for the SRAM cell will be formed in the conventional width active areas 46.

Figure 3C:
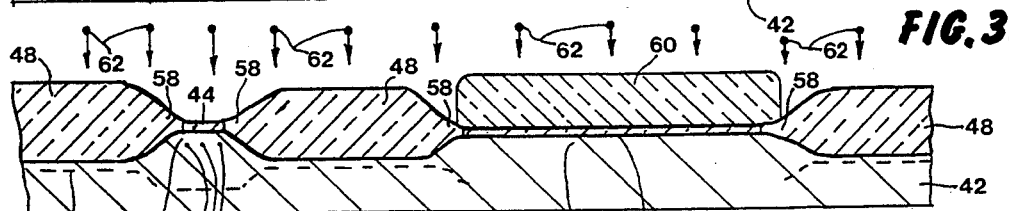

After formation of the silicon nitride mask 50, and as shown in FIG. 3C, a field oxide 48 is formed on the substrate 42 for isolating the active areas 44, 46. Suitable processes for growing the field oxide 48 are well known in the art and are known generally as local oxidation of silicon processes (LOCOS). As an example, the field oxide 48 can be grown in a wet oxygen atmosphere at about 800°–1200° C. for about 6–10 hours. This forms a field oxide 48 that is approximately 2000 Å to 6000 Å thick. The field oxide 48 includes bird's beak areas 58.

Following formation of the field oxide 48, the substrate 42 is subjected to a local implanted field step or LIF. During the LIF step the conventional width active areas 46 are protected with a photoresist mask 60. The narrow width active areas 44 are left exposed. This is a departure from conventional LIF processes in which the narrow width active areas 44 are typically covered with resist. As previously explained, however, the formation of a photoresist mask in alignment with the pattern of narrow width active areas 44 is extremely difficult with current photolithography techniques.

During the LIF step a field implant dopant 62 is implanted through the field oxide 48 and into the substrate 42 to form isolation field areas on the substrate 42. Implanting of the field implant dopant 62 can be accomplished using standard ion implantation equipment. The exact process will depend on the device requirements. As an example, high energy p-type implants (e.g. boron) may be used to define field isolation between n-transistors. The peak concentration of the p-type field implant dopant 62 into the substrate is indicated by dotted line 64 in FIG. 3D.

The narrow width active areas 44 include channel region 70 for the access transistor that will ultimately be formed in this active area 44. The conventional width active areas 46 also include channel regions 68 for the transistors that will ultimately be formed in this active area 46.

Implanting of a p-type field implant dopant 62 into the narrow width active areas 44 will tend to increase the threshold voltage (Vt) of an n-channel access transistor ultimately formed in the narrow width active area 44. As an example, a conventional n-channel access transistor having a width of about 0.5 μm, and a gate oxide thickness of about 120 Å will have a threshold voltage (Vt) of about 0.8 v. The increase in this threshold voltage the to the implant of a p-type field dopant will be about 300 millivolts. Because it is so difficult to protect the narrow width active area 44 with a patterned resist, however, this increase is not significantly higher than the increase that occurs with the narrow width active area 44 protected by a patterned resist. This is because using conventional photolithography techniques, a resist pattern cannot be aligned accurately enough to completely cover the narrow width active area 44.

Figure 3D:
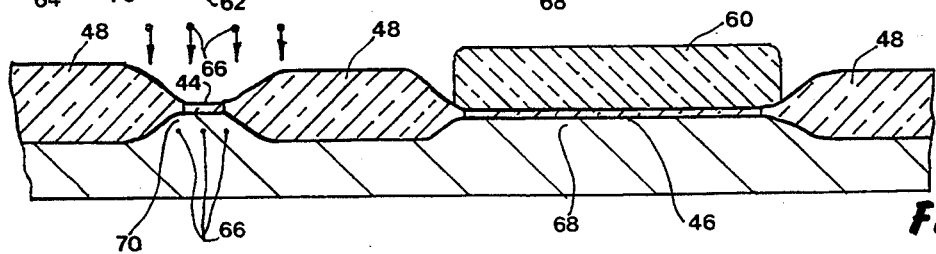

Following the LIF step, a low energy implant is performed on the narrow width active area 44 by implanting a low energy dopant 66. This is shown in FIG. 3D. For an n-conductivity access transistor, the low energy dopant 66 is adapted to lower the threshold voltage of the access transistor. Accordingly, for an n-conductivity access transistor, the low energy implant is performed using an n-type dopant. Suitable n-type dopants include phosphorus, arsenic and antimony.

During the low energy implant step, the conventional width active areas 46 are protected by the resist mask 60 that was formed during the field implant step (FIG. 3C). The low energy implant is preferably as high as possible but not so high as to penetrate the bird's beak areas 58 of the field oxide 48 adjacent to the conventional width active areas 46. An implant energy may be in the range of 10 keV to 100 keV for phosphorus.

Even if the low energy dopant 66 does penetrate the bird's beak 58 of the conventional width active areas 46, however, the threshold voltage (Vt) of the subsequently formed active device would not necessarily fall below acceptable levels. The SRAM cell could in fact be designed to accommodate some penetration by the low energy dopant 66.

The concentration of the low energy dopant 66 will depend on the concentration of the field implant dopant 62 and on the circuit requirements. As an example, a concentration of the low energy dopant may be in the range of $1\times10^{16}$ to $1\times10^{18}$ cm$^{-3}$.

As is apparent, with the method of the invention a separate masking step for adding a low energy implant into the narrow width active is eliminated. Moreover, no additional mask steps are required for performing the low energy implant. The low energy implant is thus effectively self-aligned with the narrow width active areas 66. Finally, the parameters of the low energy implant (e.g. concentration of dopant, implant energy level) can be controlled to tailor the electrical characteristics of the narrow width active areas 44 and thus the access devices ultimately formed in these areas.

Figure 4A:
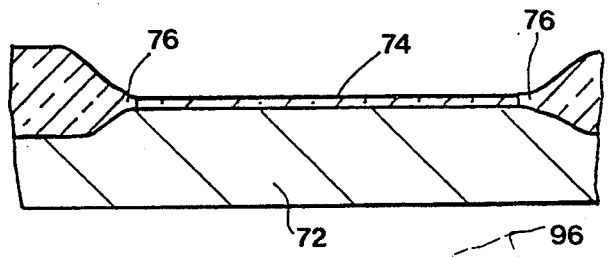
FIGS. 4A-4C and 4CC are schematic drawings showing a process for tailoring the electrical characteristics of different regions of a semiconductor device in accordance with the method of the invention.
Figure 4B:
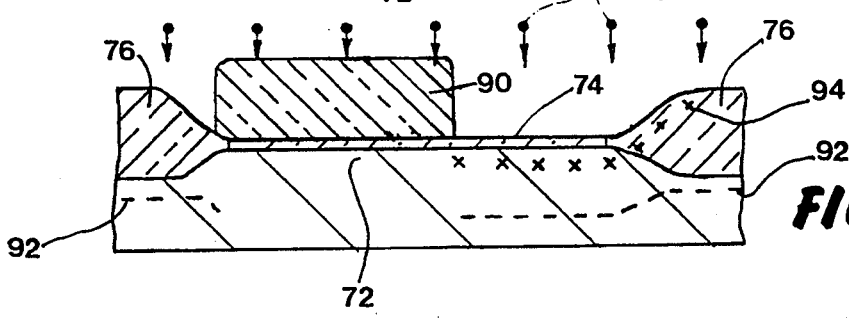
Figure 4C:
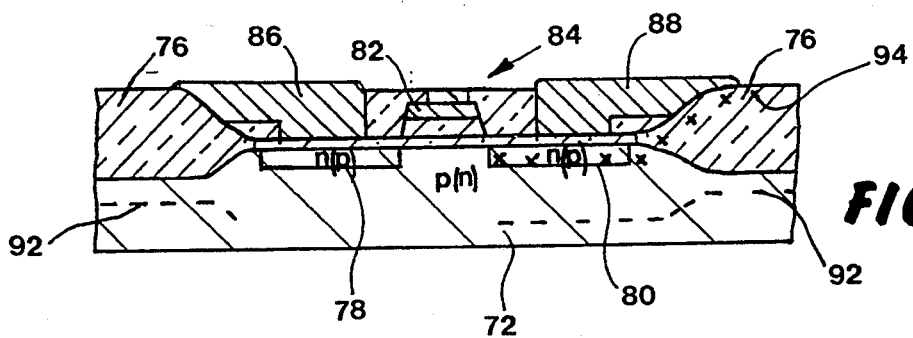
Figure 4C:
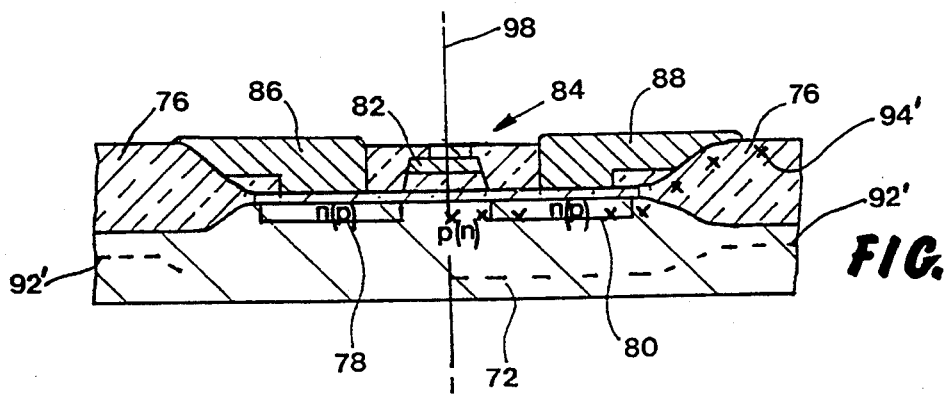

Referring now to FIGS. 4A–4C, the method of the invention is shown for tailoring the electrical characteristics of different regions of an active semiconductor device. As shown in FIG. 4A, a substrate 72 includes active areas 74 separated by field oxide 76. As shown in FIG. 4C, a (FET) transistor 84 will be formed in the active area 74. The transistor 84 includes a source 78, a drain 80 and a gate structure 82. In some applications, it may be desirable to tailor the electrical characteristics of the source 78 and drain 80 regions of the transistor 84.

As shown in FIG. 4B, during the LIF step a field implant dopant 78 is implanted through the field oxide 76 and into the substrate 72. In accordance with the invention, during the LIF step a photoresist mask 90 is used to block a portion of the active area 74. As an example, the blocked portion of the active area 74 may be the source 78 of the transistor 84 ultimately formed in the active area 74. If the transistor 84 is an n-channel device a high energy p-type field implant dopant 96 may be used to define the field isolation between the n-channel devices. In this case, the protected source 78 formed beneath the photoresist mask 90 will have a lower junction capacitance than the drain 80.

This may be useful if the transistor 84 is the access device of a DRAM cell. In such a cell bitline capacitance is a serious issue. If contact 86 to the source 78 is connected to a bit line, a major component in the bitline capacitance is the junction capacitance of the source 78. The drain 80, on the other hand, will be connected through a contact 88 to a cell capacitor through the cell side of the transistor 84. Because of the LIF implant, the drain 80 will have a higher capacitance than the source 78. Higher capacitance on the cell side of an access transistor 84 however is desirable to improve SER immunity. Further, following the LIF step, the unprotected area of the active area 74 may be subjected to a low energy implant substantially as previously described. Such a low energy implant may be used to lower (or raise) the Vt of any unprotected future transistor channel regions without impacting the field regions because the energy of the implant is chosen such that it does not penetrate the thicker field oxide.

In FIG. 4B the peak concentration of the LIF implant is indicated by broken dotted line 92. The concentration of the low energy implant is indicated by the Xed line 94. In 4B, a portion of the active area occupied by the gate structure 82 was blocked totally during the implant of the high energy p-type field implant dopant 96. Alternately, approximately half of the active area 74 can be exposed and approximately half can be blocked. As shown in FIG. 4CC, this forms a low energy implant concentration 94' and an LIF implant concentration 92' which extend under approximately half of the gate structure 82 to the center line 98 of the transistor 84.

Although the invention has been described in terms of preferred embodiments, as will be apparent to those skilled in the art other applications of the inventive concepts disclosed herein are possible. As an example, the method of the invention can be used in the fabrication of devices other than narrow width devices. In addition, the method of the invention can be used for either lowering or raising the threshold voltage (Vt) of a device. It is intended therefore that the following claims include such alternate embodiments.

What is claimed is:

1. A method for fabricating semiconductor devices, comprising:
   providing a silicon substrate;
   defining active areas on the substrate;
   isolating the active areas with a field oxide having a bird's beak area;
   forming a patterned mask for exposing selected active areas while protecting the remaining active areas;
   performing a field implant using the patterned mask by implanting a field implant dopant with sufficient energy such that it penetrates through the field oxide and into the substrate for defining isolation field areas on the substrate;
   performing a second implant using the patterned mask by implanting a second dopant at an energy level such that the second dopant does not penetrate through the bird's beak area of the field oxide but does penetrate into the exposed selected active areas for tailoring electrical characteristics of the selected active areas for forming a first type of semiconductor device with a first width while protecting the remaining active areas for forming a second type of semiconductor device with a second width; and
   continuing processing to form active semiconductor devices in the active areas.

2. The method as recited in claim 1 and wherein the field implant dopant is a p-conductivity type dopant and the second dopant is an n-conductivity type dopant.

3. The method as recited in claim 1 and wherein the first type of semiconductor devices have a width between 0.4 to 1 $\mu$m.

4. The method as recited in claim 1 and wherein the active semiconductor devices include n-channel transistors formed in the selected active areas.

5. The method as recited in claim 1 and wherein the active semiconductor devices include n-channel transistors formed in the selected active areas and the second dopant is an n-conductivity type dopant.

6. The method as recited in claim 1 and wherein the active semiconductor devices include n-channel transistors formed in the selected active areas and the second dopant is selected from the group consisting of phosphorus, arsenic, and antimony.

7. A method of fabricating semiconductor devices, comprising;
   providing a silicon substrate;

defining active areas on the substrate;

isolating the active areas using a local oxidation of silicon process to form a field oxide between the active areas said field oxide including a bird's beak area;

forming a patterned photoresist mask fox exposing select active areas while covering the remaining active areas;

performing a field implant using the photoresist mask by implanting a field implant dopant through the field oxide and into the substrate for defining isolation field areas on the substrate;

performing a second implant using the photoresist mask for exposing the select active areas while the remaining active areas remain covered by implanting a second dopant into the select active areas at an energy level such that the second dopant does not penetrate through the field oxide nor the bird's beak area thereof in order to form a first type of semiconductor device with a first width in the select active areas and a second type of semiconductor device with a second width in the covered active areas; and continuing processing of the substrate to form active semiconductor devices in the active areas.

8. The method as recited in claim 7 and wherein the field implant dopant is a p-type dopant and the second dopant is an n-type dopant for lowering the threshold voltage of the first type devices.

9. The method as recited in claim 7 and wherein the first type devices include n-channel devices and the second dopant is n-type selected from the group consisting of phosphorus, arsenic and antimony.

10. The method as recited in claim 7 and wherein the field implant dopant is an n-type dopant and the second dopant is a p-type dopant for raising the threshold voltage of the first type devices.

11. The method as recited in claim 7 and wherein the first type devices are n-channel MOFSETs formed as access transistors of an SRAM cell.

12. A method of fabricating an SRAM cell having an access transistor with a low threshold voltage, said method comprising the steps of:

providing a silicon substrate;

defining active areas on the substrate including a select active area having a width of between about 0.4 μm to 1 μm in which the access transistor will be formed;

isolating the active areas using a local oxidation of silicon process to form a field oxide between the active areas said field oxide including a bird's beak area;

forming a patterned mask for exposing the select active area while covering the remaining active areas;

performing a field implant using the patterned mask by implanting a field dopant through the field oxide and into the substrate for defining isolation field areas on the substrate;

performing a second implant on the select active area using the patterned mask by implanting a second dopant into the select active area, said second implant performed at an energy level such that the second dopant does not penetrate the field oxide nor the bird's beak area thereof; and continuing processing of the active areas to complete the SRAM cell.

13. A method of forming a semiconductor transistor and for tailoring electrical characteristics of a source or drain region of the transistor, said method comprising the steps of:

providing a silicon substrate;

defining active areas on the substrate;

isolating the active areas using a local oxidation of silicon process to form a field oxide between the active areas said field oxide including a bird's beak area;

forming a patterned mask for exposing a first portion of selected active areas while covering a second portion of the selected active areas and remaining active areas;

performing a field implant using the patterned mask by implanting a field dopant through the field oxide and into the substrate for defining isolated field areas on the substrate and into the exposed first portions of the selected active areas for altering electrical characteristics of the exposed first portions;

forming either the source or drain of the transistor in the exposed first portion of the selected active areas such that the source and drain have different electrical characteristics by performing a second implant using the patterned mask wherein a second dopant is implanted into the exposed first portion at an energy level such that the second dopant does not penetrate through the bird's beak of the field oxide.

14. The method as claimed in claim 13 and wherein the transistor is an access device in a DRAM connected to a bit-line and to a cell line.

15. The method as claimed in claim 14 and wherein the field dopant is a p-type dopant and the source or drain formed in the exposed first portion of the active area is connected to the cell line and has a higher junction capacitance than a source or drain formed in the covered second portion which is connected to the bit line.

* * * * *

UNITED STATES PATENT AND TRADEMARK OFFICE
CERTIFICATE OF CORRECTION

PATENT NO. : 5,405,788
DATED : April 11, 1995
INVENTOR(S) : Monte Manning et al.

It is certified that error appears in the above-indentified patent and that said Letters Patent is hereby corrected as shown below:

Column 1, line 1, please insert:

--This invention was made with Government support under Contract No. MDA972-92-C-0054 awarded by Advanced Research Projects Agency (ARPA). The Government has certain rights in this invention.--

Signed and Sealed this

Twenty-second Day of August, 1995

Attest:

BRUCE LEHMAN

*Attesting Officer*      *Commissioner of Patents and Trademarks*